US009927725B2

(12) United States Patent
Miyajima et al.

(10) Patent No.: US 9,927,725 B2
(45) Date of Patent: Mar. 27, 2018

(54) LITHOGRAPHY APPARATUS, LITHOGRAPHY METHOD, PROGRAM, LITHOGRAPHY SYSTEM, AND ARTICLE MANUFACTURING METHOD

(71) Applicant: CANON KABUSHIKI KAISHA, Tokyo (JP)

(72) Inventors: Yoshikazu Miyajima, Utsunomiya (JP); Hitoshi Nakano, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 1 day.

(21) Appl. No.: 15/044,223

(22) Filed: Feb. 16, 2016

(65) Prior Publication Data

US 2016/0238946 A1  Aug. 18, 2016

(30) Foreign Application Priority Data

Feb. 16, 2015 (JP) .................................. 2015-027968
Dec. 9, 2015 (JP) .................................. 2015-239907

(51) Int. Cl.
*G03F 7/20* (2006.01)

(52) U.S. Cl.
CPC ...... *G03F 7/70991* (2013.01); *G03F 7/70483* (2013.01); *G03F 7/70525* (2013.01)

(58) Field of Classification Search
CPC ............. G03F 7/70191; G03F 7/70483; G03F 7/70783; G03F 7/70525
USPC ............................................. 355/53, 72–76
See application file for complete search history.

(56) References Cited

U.S. PATENT DOCUMENTS

| 6,930,757 | B2 | 8/2005 | Sato et al. |
| 8,956,143 | B2 | 2/2015 | Furumoto et al. |
| 9,244,726 | B2 | 1/2016 | Slot et al. |
| 9,349,624 | B2 | 5/2016 | Wilby |
| 9,423,700 | B2 | 8/2016 | Koga et al. |
| 2003/0211410 | A1* | 11/2003 | Irie ..................... G03F 7/70525 430/22 |
| 2006/0203232 | A1* | 9/2006 | Okita ........................ G03F 1/84 356/237.2 |

(Continued)

FOREIGN PATENT DOCUMENTS

| JP | 2000036451 A | 2/2000 |
| JP | 2002064046 A | 2/2002 |
| JP | 2004071978 A | 3/2004 |

(Continued)

OTHER PUBLICATIONS

Office Action issued in Japanese Application No. 2015-239907 dated Sep. 6, 2016. English translation provided.

*Primary Examiner* — Hung Henry Nguyen
(74) *Attorney, Agent, or Firm* — Rossi, Kimms & McDowell LLP

(57) ABSTRACT

A lithography apparatus has a plurality of processing units configured to respectively perform patternings on a plurality of substrates that belong to a lot, and a controller configured to perform, based on specific information that specifies one of the plurality of substrates, determination of one of the plurality of processing units that processes the one of the plurality of substrates, and control the plurality of processing units such that the patternings are performed on the plurality of substrates respectively with the plurality of processing units in parallel based on recipe information corresponding to the lot.

19 Claims, 9 Drawing Sheets

(56) References Cited

U.S. PATENT DOCUMENTS

2015/0008605 A1 1/2015 Sato
2015/0022793 A1* 1/2015 Koga .................. G03F 7/70191
                                                        355/53

FOREIGN PATENT DOCUMENTS

| JP | 2004153191 A | 5/2004 |
|----|--------------|--------|
| JP | 2007214551 A | 8/2007 |
| JP | 2010153601 A | 7/2010 |
| JP | 2011514006 A | 4/2011 |
| JP | 2011210992 A | 10/2011 |
| JP | 2012142542 A | 7/2012 |
| JP | 2014515885 A | 7/2014 |
| JP | 2015023146 A | 2/2015 |
| JP | 2015029070 A | 2/2015 |
| WO | 0079356 A2 | 12/2000 |

* cited by examiner

LITHOGRAPHY APPARATUS, LITHOGRAPHY METHOD, PROGRAM, LITHOGRAPHY SYSTEM, AND ARTICLE MANUFACTURING METHOD

BACKGROUND OF THE INVENTION

Field of the Invention

The present invention relates to a lithography apparatus, a lithography method, a program, a lithography system, and an article manufacturing method.

Description of the Related Art

A lithography apparatus forms a pattern (for example, for machining) on a material to be processed (a substrate) in a lithography process included in a manufacturing process of an article such as a semiconductor device, a MEMS, or the like. As an example of the lithography apparatus, an imprint apparatus for forming an uncured resin on the substrate using a mold and forming a resin pattern on the substrate is provided. For example, the imprint apparatus employs a photo-curing method of coating a shot region on a substrate with a photo-curable resin in an uncured state, and performing mold release (releasing) after curing the resin by radiating light in a state in which the resin is formed by the mold. Japanese Patent Laid-Open No. 2011-210992 discloses a cluster-type lithography apparatus including a plurality of processing units (lithography units) configured to improve productivity, and a conveyance unit configured to convey a substrate or an original plate to the plurality of processing units.

Here, the plurality of processing units in the lithography apparatus disclosed in Japanese Patent Laid-Open No. 2011-210992 have different properties of patterning or are classified into several groups. Meanwhile, properties of a pattern already formed on the plurality of substrates that belong to one lot are also different for causes such as properties of the apparatus that forms the pattern or are classified into several groups. For this reason, it is not preferable in view of superposition precision for the plurality of substrates that belong to one lot to be processed by arbitrary processing units among the plurality of processing units.

SUMMARY OF THE INVENTION

The present invention provides, for example, a lithography apparatus advantageous in overlay precision.

The present invention is directed to provide a lithography apparatus comprising a plurality of processing units configured to respectively perform patternings on a plurality of substrates that belong to a lot, the apparatus comprising: a controller configured to perform, based on specific information that specifies one of the plurality of substrates, determination of one of the plurality of processing units that processes the one of the plurality of substrates, and control the plurality of processing units such that the patternings are performed on the plurality of substrates respectively with the plurality of processing units in parallel based on recipe information corresponding to the lot.

Further features of the present invention will become apparent from the following description of exemplary embodiments (with reference to the attached drawings).

DESCRIPTION OF THE EMBODIMENTS

Hereinafter, embodiments of the present invention will be described with reference to the accompanying drawings.

(First Embodiment)

First, a lithography apparatus according to a first embodiment of the present invention will be described. The lithography apparatus according to the embodiment is a so-called cluster-type lithography apparatus including a plurality of lithography processing units configured to perform pattern forming processing (patterning) on a plurality of (for example, 25) substrates that are supplied from a pre-processing device (to be described below) and belong to one slot, respectively. Hereinafter, in the embodiment, the cluster-type imprint apparatus using the lithography processing unit as the imprint processing unit (the imprint apparatus) will be exemplarily described.

Figure 1:
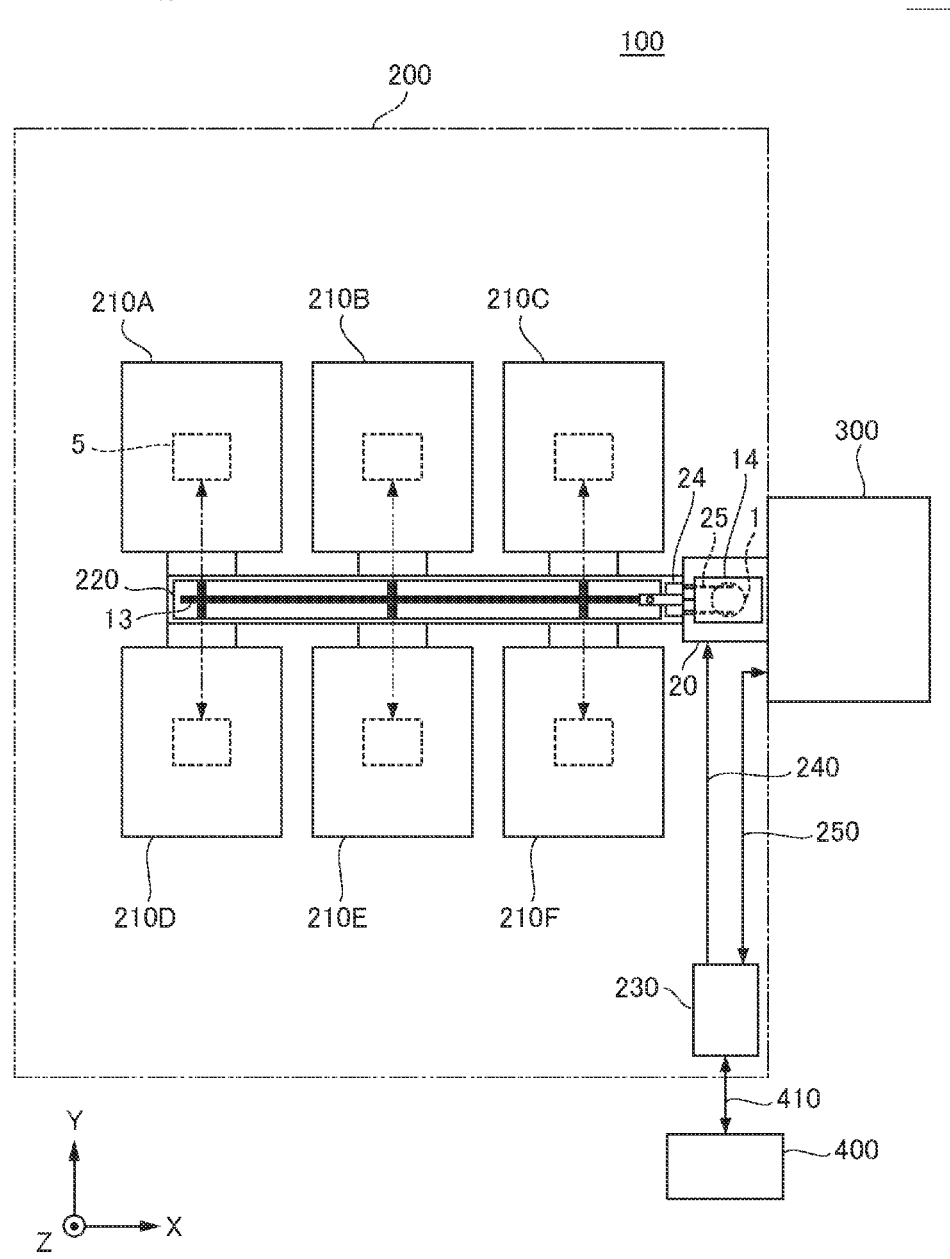
FIG. 1 is a plan view showing a configuration of a lithography apparatus according to a first embodiment of the present invention.

FIG. 1 is a schematic plan view showing a configuration of a cluster-type imprint apparatus 200 according to the embodiment and an imprint system (a lithography system) 100 including the cluster-type imprint apparatus 200. The imprint system 100 includes the cluster-type imprint apparatus 200 and a cessing device 300. The cluster-type imprint apparatus 200 includes a plurality of (in the embodiment, six as an example) imprint processing units 210 (210A to 210F), a substrate conveyance unit 220 and a cluster control unit (controller) 230.

Figure 2:
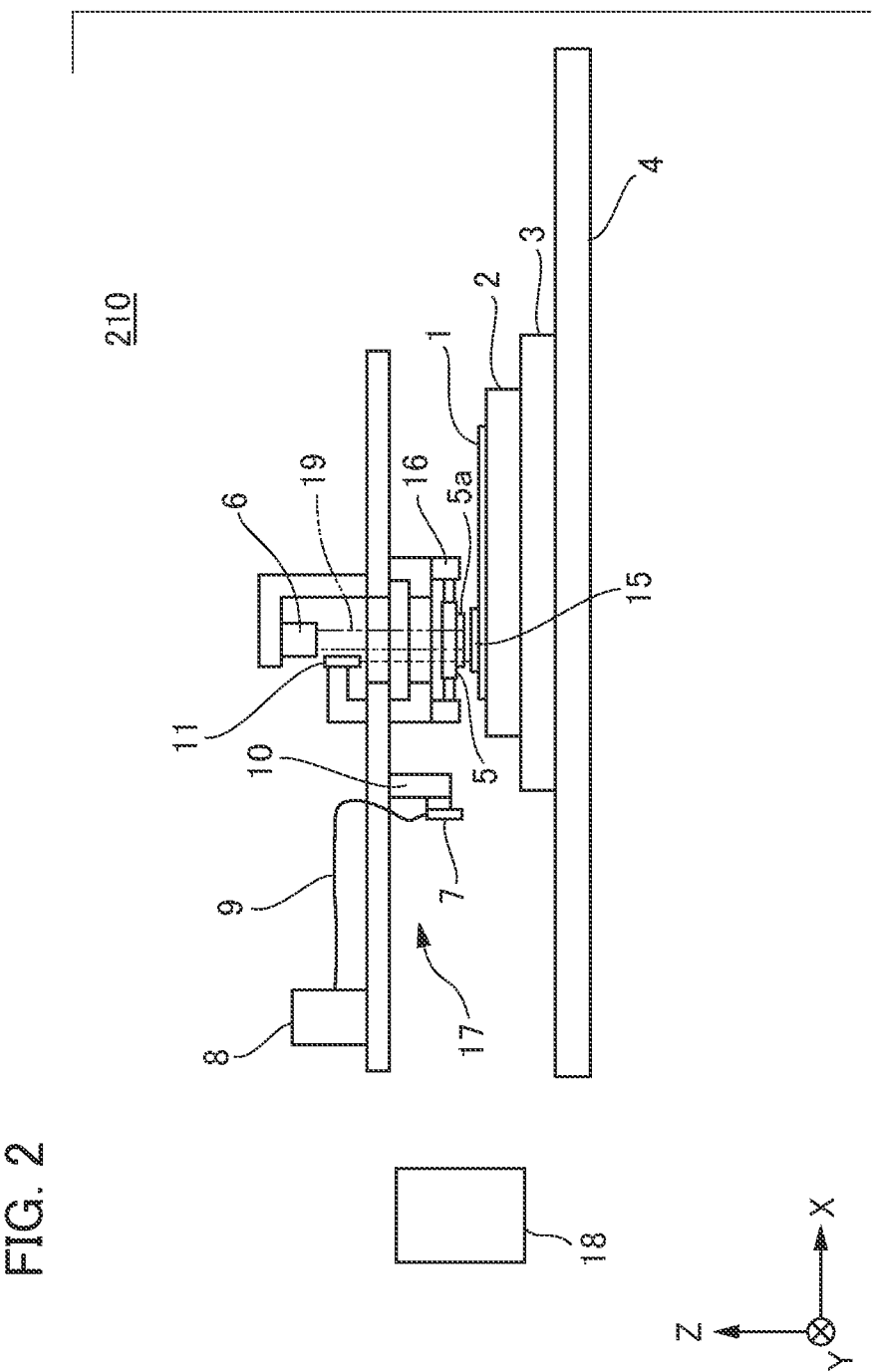
FIG. 2 is a view showing one imprint processing unit.

FIG. 2 is a schematic view showing a configuration of an imprint processing unit (hereinafter, simply referred to as a "processing unit") 210. Since the processing unit 210 performs a lithography process among manufacturing processes of a semiconductor device or the like serving as an article, an uncured resin 15 on a wafer 1 (a substrate) serving as a substrate to be processed is formed by a mold 5, and a pattern of the resin 15 is formed on the wafer 1. Further, the processing unit 210 employs a photo-curing method disclosed herein. In addition, in the drawings described below, a Z axis is provided in parallel with an optical axis of an illumination system 6 configured to radiate ultraviolet rays to the resin 15 on the wafer 1, and an X axis and a Y axis perpendicular to each other are provided in a plane orthogonal to the Z axis. The processing unit 210 includes the illumination system 6, a mold holding mechanism 16, an alignment measurement system 11, a wafer stage 3, a coating unit 17 and a processing unit control unit 18.

The illumination system 6 adjusts ultraviolet rays 19 emitted from a light source to light appropriate for imprinting and radiates the ultraviolet rays 19 to the mold 5 upon imprint processing. While a lamp such as a mercury lamp or the like may be employed as the light source, the light source is not particularly limited as long as the light source is configured to emit light having a wavelength that passes through the mold 5 and enables curing of the resin (an ultraviolet ray curing resin) 15. Further, in the embodiment, while the illumination system 6 that employs a photo-curing method is installed, for example, when a thermosetting method is employed, a heat source unit configured to cure a thermosetting resin is installed instead of the illumination system 6.

The mold 5 has an outer circumferential shape that is a polygonal shape (preferably a rectangular shape or a square shape), and a surface thereof facing the wafer 1 includes a pattern section 5a in which a concavo-convex pattern to which, for example, a circuit pattern or the like is transferred is three-dimensionally formed. Further, while pattern sizes are various according to an article serving as a manufacturing target, the pattern size also includes a pattern of tens of nanometers in the case of fine articles. In addition, a material of the mold 5 is, for example, quartz that enables penetration of the ultraviolet rays 19 and preferably has a small coefficient of thermal expansion.

While not shown, the mold holding mechanism 16 has a mold chuck configured to hold the mold 5, and a mold driving mechanism configured to hold the mold chuck and move the mold 5. The mold chuck can hold the mold 5 by pulling an outer circumferential region of a radiation surface of the ultraviolet rays 19 of the mold 5 using a vacuum adsorption force or an electrostatic force. In addition, the mold chuck and the mold driving mechanism have opening regions formed at central sections (inside) such that the ultraviolet rays 19 radiated from the illumination system 6 pass through the mold 5 toward the wafer 1. The mold driving mechanism moves the mold 5 in axial directions such that pushing together or pulling apart between the mold 5 and the resin 15 on the wafer 1 is selectively performed. For example, a linear motor or an air cylinder is used as a power source that can be employed in the mold driving mechanism. In addition, in order to support precise positioning of the mold 5, the mechanism may be constituted by a plurality of driving systems such as a coarse movement driving system, a fine movement driving system, and the like. Further, a configuration having a position adjustment function in a Z-axis direction, an X-axis direction, a Y-axis direction or a θ (rotation about the Z axis) direction, a tilt function for correcting an inclination of the mold 5, or the like, may be provided. Further, while the pushing together operation and the pulling apart operation upon the imprint processing may be realized by moving the mold 5 in the Z-axis direction, it may also be realized by moving the wafer stage 3 in the Z-axis direction or moving both of them relative to each other.

The alignment measurement system 11 optically observes an alignment mark that is previously formed at the mold 5 and an alignment mark that is previously formed at the wafer 1, and measures a relative positional relation therebetween.

The wafer 1 is, for example, a monocrystal silicon substrate or a silicon on insulator (SOI) substrate. A plurality of shot regions (patterning regions) are set on the wafer 1, and the processing units 210A to 210F sequentially perform the imprint processing on these shots.

The wafer stage 3 holds the wafer 1, and is movable for positioning between the mold 5 and the wafer 1 (the shot region) upon formation of the resin 15 on the wafer 1 by the mold 5. The wafer stage 3 has a wafer chuck 2 configured to hold the wafer 1 by an adsorption force, and a stage driving mechanism configured to hold the wafer chuck 2 by a mechanical means and movable in a direction along at least a surface of the wafer 1 on a surface plate 4. For example, a linear motor or a plane motor is provided as a power source that can be employed in the stage driving mechanism. The stage driving mechanism may also be constituted by a plurality of driving systems such as a coarse movement driving system, a fine movement driving system, and the like, with respect to the directions of the X axis and the Y axis. Further, the mechanism may have a configuration having a driving system configured to adjust a position in the Z-axis direction, a position adjustment function in the θ direction of the wafer 1, a tilt function of correcting an inclination of the wafer 1, or the like.

The coating unit 17 is installed in the vicinity of the mold holding mechanism 16, and coats the resin (uncured resin) 15 on the shot. The coating unit 17 includes an ejection section 7, a tank 8 configured to accommodate the resin 15, a supply pipeline 9 configured to supply a resin from the tank 8 to the ejection section 7, and a moving section 10 configured to move the ejection section 7. The moving section 10 positions the ejection section 7 at an ejection position for conventional ejection, and moves the ejection section 7 to a withdrawal position (a maintenance position) for maintenance (cleaning or exchange). Here, the resin 15 is an ultraviolet ray curing resin (a photo-curable resin) having a property of being cured by receiving the ultraviolet rays 19, or may be an imprint material, and is appropriately selected according to various conditions such as a device manufacturing process or the like. In addition, an amount of the resin 15 coated (ejected) from the coating unit 17 is also appropriately determined by a desired thickness of the resin 15 formed on the wafer 1, a density of a pattern to be formed, or the like.

The processing unit control unit 18 controls operations, adjustment, or the like, of the components of the processing unit 210. While not shown, the processing unit control unit 18 includes a calculation unit such as a CPU, a DSP, or the like, and a storage unit such as a memory, a hard disk, or the like, configured to store recipe information or the like. Here, the recipe information includes processing information when the wafer 1 or a lot serving as a group of the wafers 1 is processed. For example, a layout of the shot, a sequence of the shot to be imprint-processed, a processing condition of each shot, or the like, may be provided as the processing information. Among these, for example, a filling time that is a time taken to push the mold 5 onto the coated resin 15 on the wafer 1 or an exposure time that is a time taken to radiate the ultraviolet rays 19 and cure the resin 15 is provided as the processing condition. Further, a coating condition such as a kind of the resin 15, a resin coating amount that is an amount of the coated resin 15 applied per shot, or the like is also provided as the imprint condition. The cluster control unit (controller) 230 transmits the recipe information to the processing unit control unit 18 of the processing units 210A to 210F, and the processing unit control unit 18 performs the imprint processing on the wafer 1 loaded by the substrate conveyance unit 220 based on the received recipe information.

Returning to FIG. 1, a conveyance unit 220 conveys (delivers) the wafers 1 to the processing units 210A to 210F from the pre-processing device 300. The conveyance unit 220 includes, for example, a conveyance path 13 serving as a rail or a traveling guide, and a conveyance robot 24 configured to run on the conveyance path 13 having an arm that supports a hand 25 that holds the wafer 1. The arm is expandable and contractible, and also movable in the Z-axis direction and about the Z axis (the θz direction). The conveyance robot 24 receives one wafer 1 pre-processed in the pre-processing device 300 from a substrate storing unit 14 on which the one pre-processed wafer 1 is placed, then moves the wafer 1 to the processing unit 210 that handles the processing, and delivers the wafer 1 into the processing unit 210. Further, the number of installed hands 25, an operation of the conveyance robot 24, and the like will be described below in detail. Here, the cluster control unit (controller) 230 (to be described below) may acquire, for example, specific information that specifies the substrate based on the sequence of the plurality of substrates conveyed from the pre-processing device 300 that performs pre-processing on the plurality of substrates (wafers) that belong to one lot.

The cluster control unit (controller) 230 is constituted by, for example, an information processing device (a computer), and controls operations of the components of the cluster-type imprint apparatus 200. Then, the processing (the lithography method) according to the embodiment can be performed by the information processing device using the program. In addition, the cluster control unit (controller) 230 transmits various kinds of information such as recipe information and so on between the processing units 210A to 210F via communication lines (not shown) while transmitting a control signal to the conveyance unit 220 via a communication line 240.

The pre-processing device 300 is, for example, a coating apparatus for spin-coating an adhesion layer on the wafers 1 of the lot designated by the cluster-type imprint apparatus 200 serving as the processing before performing the imprint processing at the processing units 210A to 210F. The adhesion layer is a layer formed on the entire surface of the wafer 1 to improve adhesiveness of the resin 15 and the wafer 1 and improve spreadability of the uncured resin 15 on the surface of the wafer 1, and is formed of, for example, a photoreaction-related monomolecular film or a material including reactive functionality or the like. Further, here, while the pre-processing device 300 is a coating apparatus as an example, the pre-processing device 300 is not particularly limited as long as the apparatus performs the pre-processing serving as the imprint processing at the processing units 210. For example, the pre-processing device 300 may be an apparatus for performing heat treatment for setting a film on the wafer 1 after chemical processing such as film formation or the like is performed. In addition, while not shown, the pre-processing device 300 can install (accommodate) a plurality of FOUPs corresponding to the processing units 210A to 210F at a front surface thereof (in FIG. 1, an opposite side of the cluster-type imprint apparatus 200). "FOUP" is an abbreviation for "front opening unified pod."

Figure 3A:
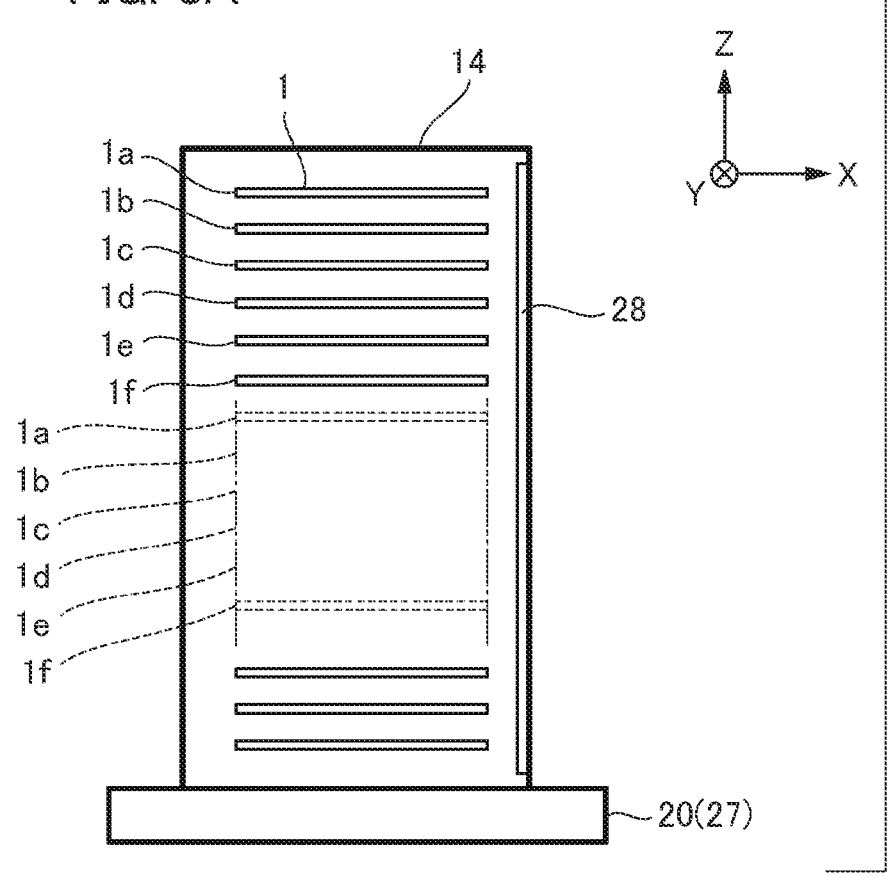
FIG. 3A is a side view showing a substrate storing unit.
Figure 3B:
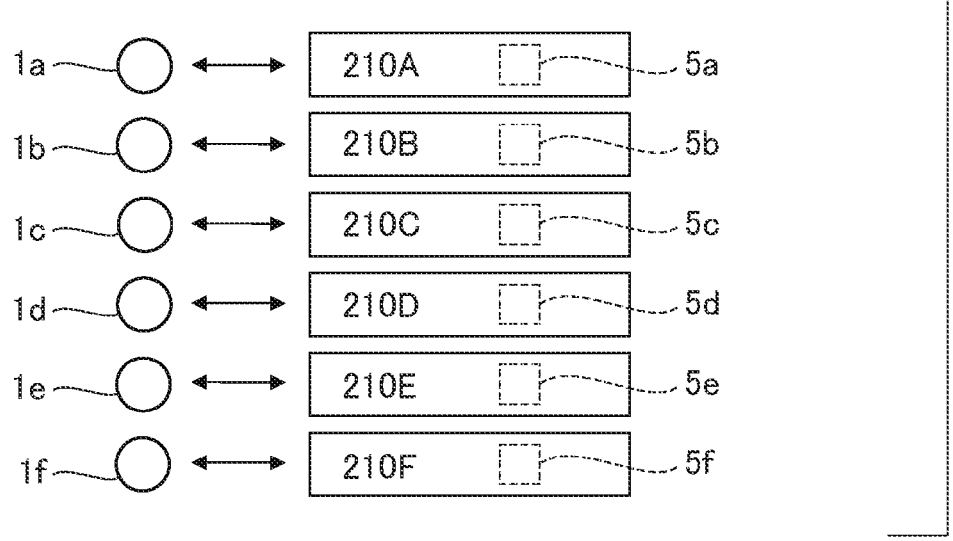
FIG. 3B is a view showing specific information of each wafer.

FIGS. 3(A) and 3(B) are views showing the substrate storing unit 14, the wafers 1 accommodated therein, and specific information (1a to 1f) related to the wafers 1. Among these, FIG. 3(A) is a schematic side view showing the substrate storing unit 14 disposed in the vicinity of the pre-processing device 300 and placed on an installation section 20 (see FIG. 1) that continues to the conveyance path 13 of the conveyance unit 220. The adhesion layer formed by the pre-processing device 300 should be formed such that a time at which the resin 15 is ejected into the processing units 210A to 210F is within a defined time after the coating. For this reason, the wafers 1 on which the adhesion layer is formed corresponding to the number of wafers of the lot are received in the substrate storing unit 14 on the installation section 20. In the embodiment, the plurality of wafers 1 stored in the substrate storing unit 14 are classified into a plurality of groups, and individually identified (specified) by the cluster control unit (controller) 230. For example, since the cluster-type imprint apparatus 200 has the six processing units 210A to 210F, the plurality of wafers 1 (the wafers 1a to 1f) can be classified into six kinds of groups to be divided among all of the processing units. Specifically, the cluster control unit (controller) 230 previously determines to which group each wafer 1 belongs based on, for example, mold type information, defect position information, recipe information including a coating condition of the resin 15, or the like. Here, the mold type information is information showing which mold 5 (5a to 5f) was used to form the pattern when the pattern (a base pattern) is already formed on the wafer 1. The defect position information is information showing a position of the specified shot in which a defect occurs in the pattern when the pattern is already formed on the wafer similar to the above. The defect position information includes, for example, the case in which foreign substances are present on the specified wafer 1 according to foreign substance inspection inside and outside the cluster-type imprint apparatus 200, or the like. Further, there may also be cases in which the mold type information or the defect position information is included in the recipe information rather than being independent from the recipe information. In addition, the cluster-type imprint apparatus 200 may have a receiving unit configured to receive information related to the determination such as the classified information or the like. In this case, the cluster control unit (controller) 230 can perform the processing of all of the processing units 210A to 210F corresponding to the wafers 1 by acquiring the specific information of the wafers 1 and receiving the information related to the determination. In the embodiment, the cluster control unit (controller) 230 serving as the acquisition unit acquires the information related to the determination from the pre-processing device 300 or an upper control device 400 via a communication line 250 or 410. Further, the cluster control unit (controller) 230 determines processing conditions for patterning in the plurality of processing units based on the specific information (at least one of mold type information, defect position information, a coating condition, and so on, corresponding thereto) and the recipe information.

FIG. 3(B) is a schematic view showing a correspondence relation between the specific information and the group. The specific information (here, corresponding to all of the wafers 1a to 1f) is combined with all of the processing units 210A to 210F corresponding to the six groups. For example, as the specified wafer 1 that is the wafer 1a processed by the processing unit 210A that is the first group, the specified wafer 1 that is the wafer 1b is processed by the processing unit 210B that is the second group.

Further, an integrated control unit (not shown) connected to the cluster control unit (controller) 230 and the pre-processing device 300 or the upper control device 400 via the communication line and configured to integrate the entire imprint system 100 may be provided. In this case, the cluster control unit (controller) 230 may receive the specific information via the integrated control unit.

Figure 4A:
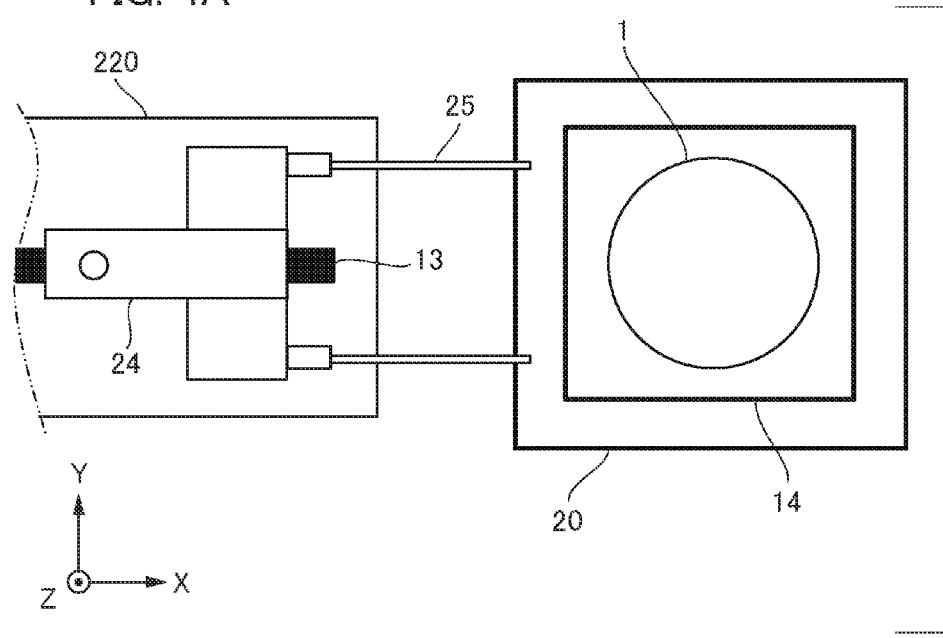
FIG. 4A is a plan view showing a state immediately before a wafer is received from a substrate storing unit.
Figure 4B:
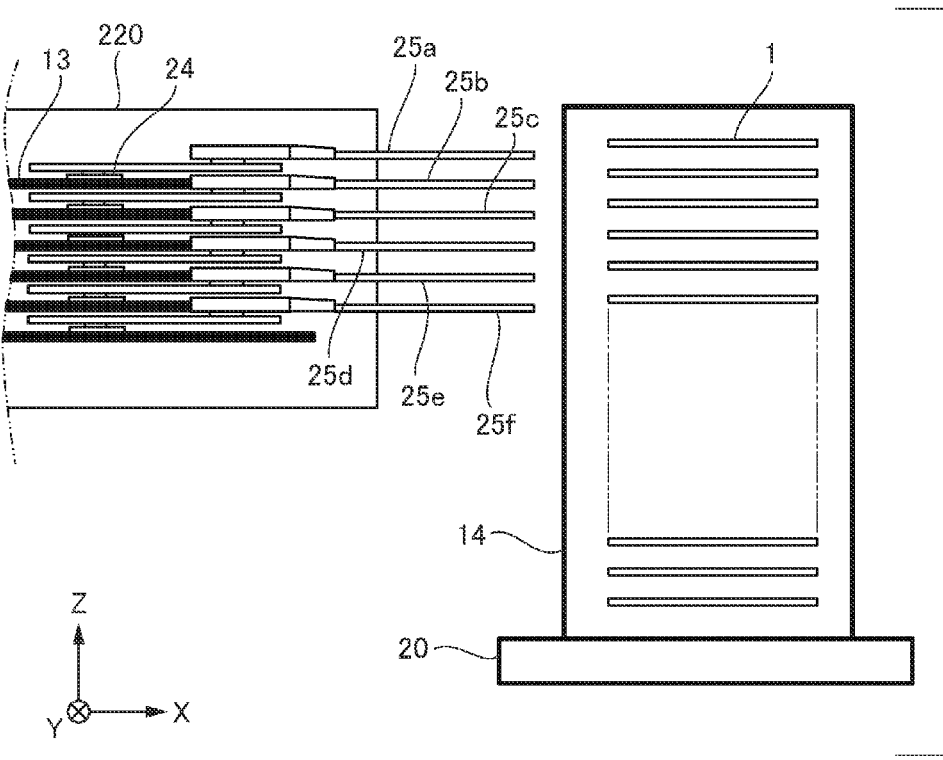
FIG. 4B is a side view showing the state immediately before the wafer is received from the substrate storing unit.

Next, operation control of the cluster-type imprint apparatus 200 will be described. FIGS. 4(A) and 4(B) are schematic views of a state immediately before the conveyance robot 24 receives the wafers 1 from the substrate storing unit 14 in which the plurality of wafers 1 are stored.

Among these, FIG. 4(A) is a plan view and FIG. 4(B) is a side view. Since the hands 25 should be able to convey the wafers 1 serving as the processing targets to the six processing units 210A to 210F at once, the six hands 25a to 25f are installed at one conveyance robot 24. Specifically, when the substrate storing unit 14 stores the plurality of wafers 1 in the Z-axis direction in parallel as shown in FIG. 4(B), the hands 25a to 25f are installed to match the storage positions of the plurality of wafers 1.

Figure 5A:
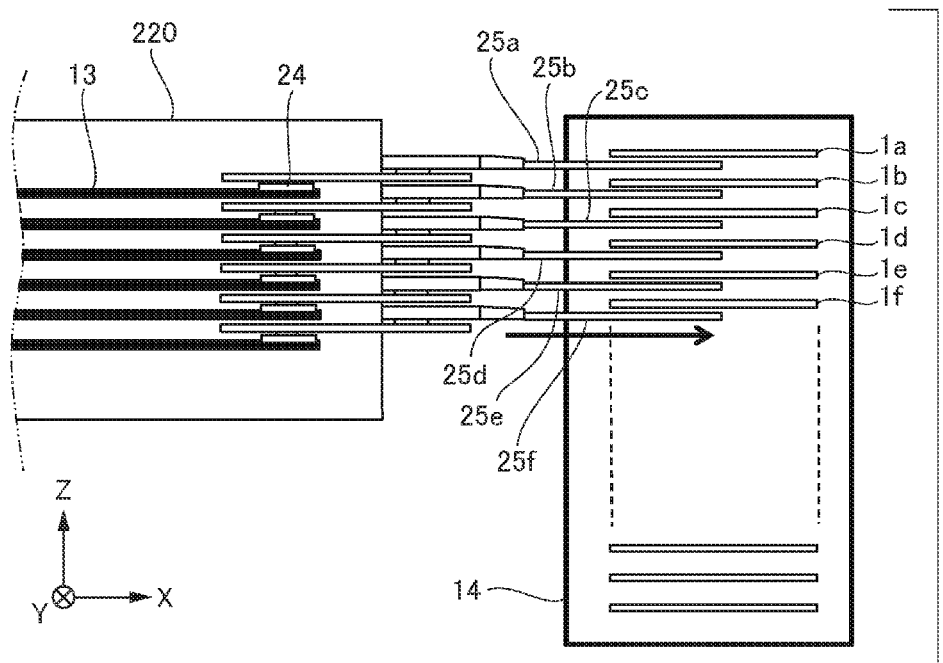
FIG. 5A is a side view showing a state immediately before the wafer is conveyed from the substrate storing unit.
Figure 5B:
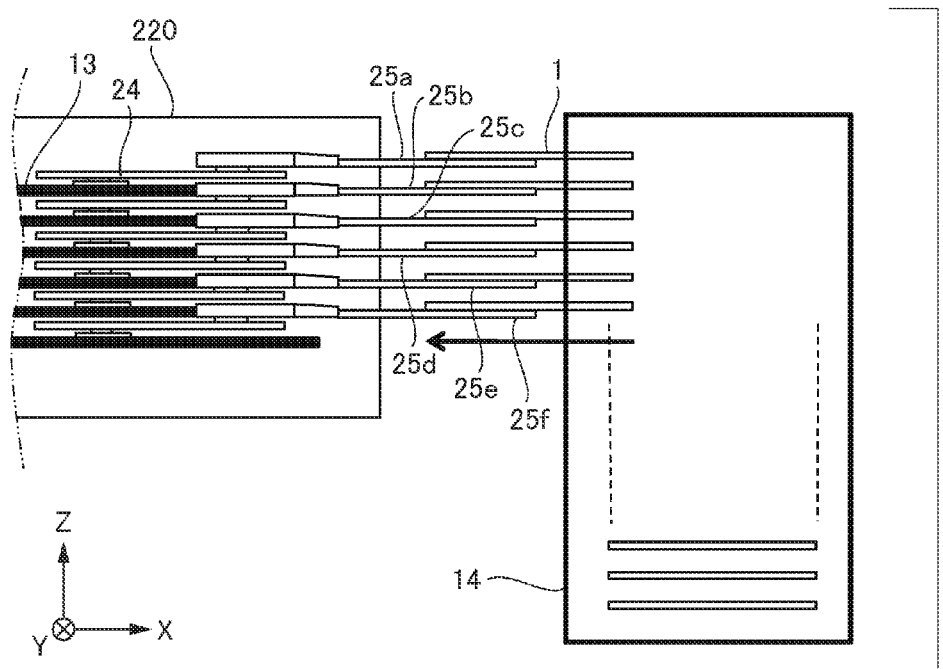
FIG. 5B is a side view showing a state immediately before the wafer is unloaded from the substrate storing unit.

FIG. 5 is a schematic side view chronologically showing a state in which the conveyance robot 24 receives the wafers 1 from the substrate storing unit 14 in which the plurality of wafers 1 are stored using FIGS. 5(A) and 5(B). First, as shown in FIG. 5(A), the hands 25a to 25f simultaneously enter the substrate storing unit 14 in a direction of an arrow, and individually hold the wafers 1a to 1f combined with the processing units 210A to 210F, respectively. Next, as shown in FIG. 5(B), the hands 25a to 25f simultaneously unload the wafers 1a to 1f from the substrate storing unit 14 in a direction of an arrow.

Figure 6:
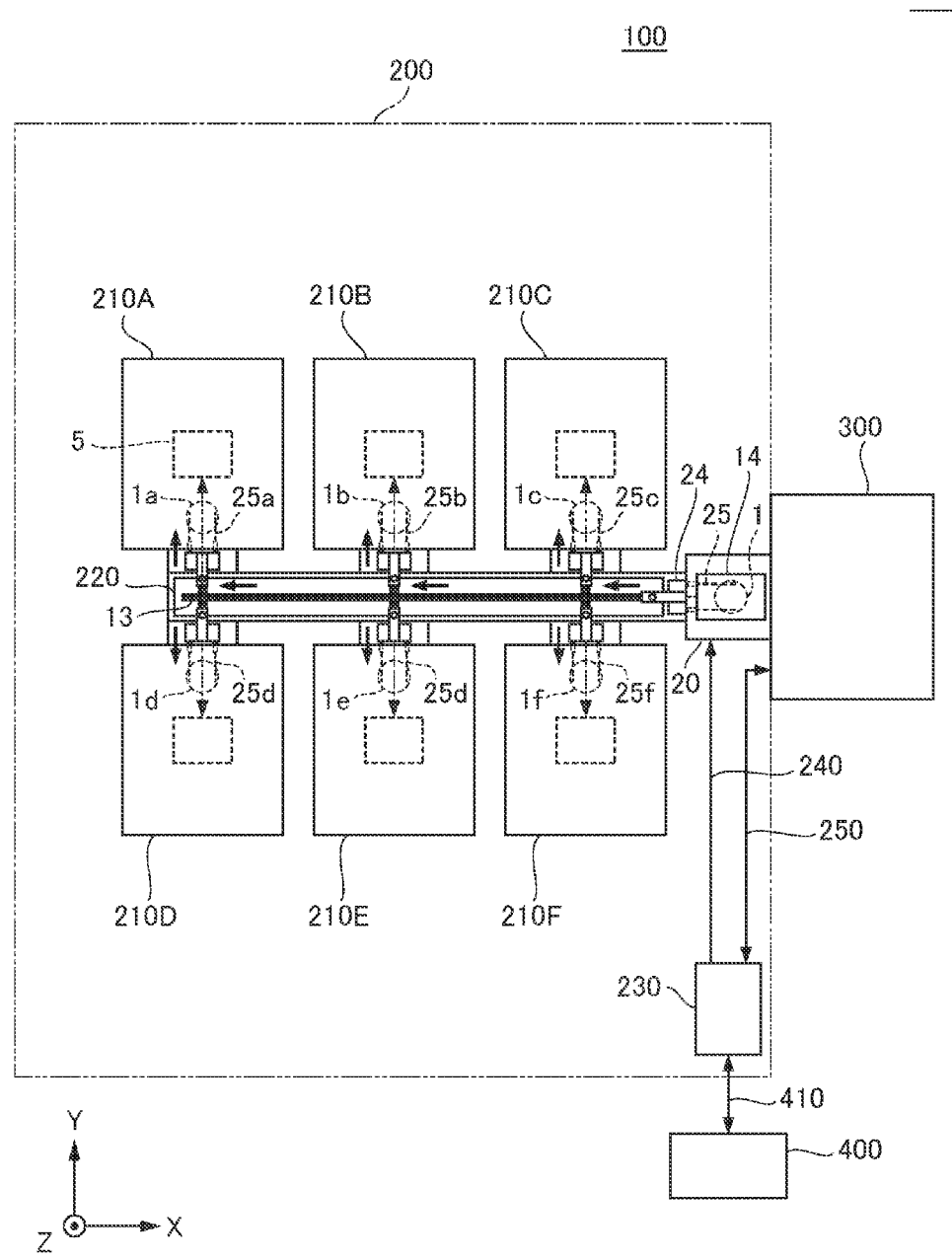
FIG. 6 is a plan view showing a state in which wafers are conveyed to the processing units from the substrate storing unit in sequence.

FIG. 6 is a schematic plan view showing a state in which the conveyance robot 24 sequentially conveys the wafers 1a to 1f unloaded from the substrate storing unit 14 to the processing units 210A to 210F. Here, the cluster control unit (controller) 230 loads the wafers 1a to 1f into all of the processing units of the processing units 210A to 210F, which are previously combined, through a moving path from the conveyance robot 24 shown by arrows. After that, the cluster control unit (controller) 230 processes the wafers 1a to 1f at the processing units 210A to 210F in parallel.

Figure 7:
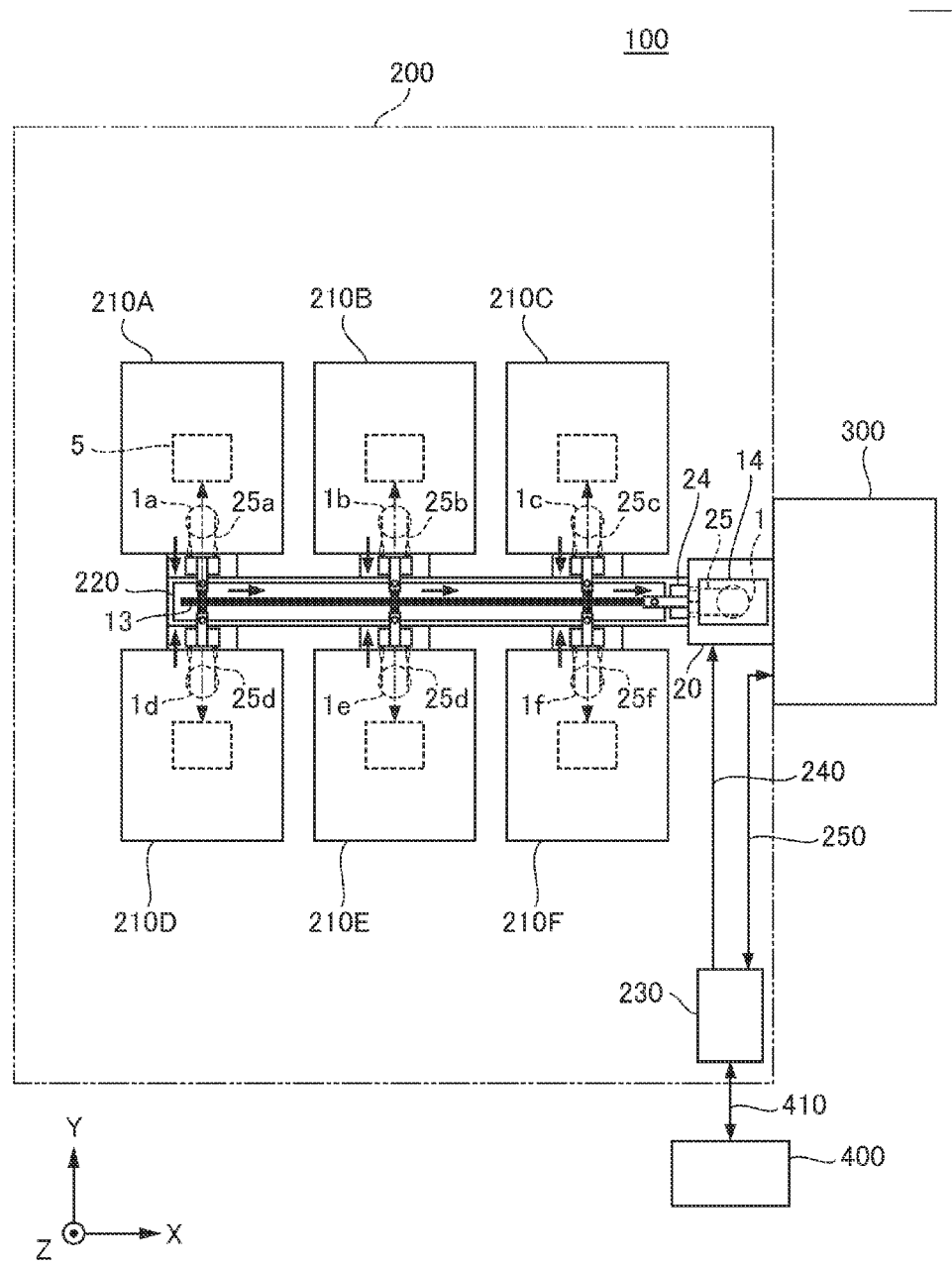
FIG. 7 is a plan view showing a state in which the wafers are collected from the processing units and returned to the substrate storing unit in sequence.

FIG. 7 is a schematic plan view showing a state in which the conveyance robot 24 sequentially collects the wafers 1a to 1f imprint-processed at the processing units 210A to 210F and conveys (returns) the wafers to the substrate storing unit 14. Here, the cluster control unit (controller) 230 unloads the wafers 1a to 1f from the processing units 210A to 210F along a moving path toward the conveyance robot 24 shown by arrows, and conveys the wafers to the substrate storing unit 14.

In this way, the cluster control unit (controller) 230 determines an optimal processing unit to process the individual wafer 1 in the lot from the plurality of processing units 210A to 210F based on the specific information. Here, the specific information and the group including all of the plurality of processing units 210A to 210F have previously corresponding relations in consideration of properties of the patterning as described above. Accordingly, the wafers 1 are individually imprint-processed in the cluster-type imprint apparatus 200 under the conditions in which the superposition precision is increased most.

As described above, according to the embodiment, the lithography apparatus advantageous for superposition precision can be provided.

(Second Embodiment)

Next, a lithography apparatus according to a second embodiment of the present invention will be described. In the cluster-type imprint apparatus 200 of the first embodiment, the cluster control unit (controller) 230 acquires the specific information for specifying the wafers 1a to 1f from the pre-processing device 300 or the upper control device 400. On the other hand, a characteristic of the cluster-type imprint apparatus according to this embodiment is that the cluster control unit (controller) 230 acquires the specific information based on the position of the wafer 1 stored in the substrate storing unit 14.

Figure 8:
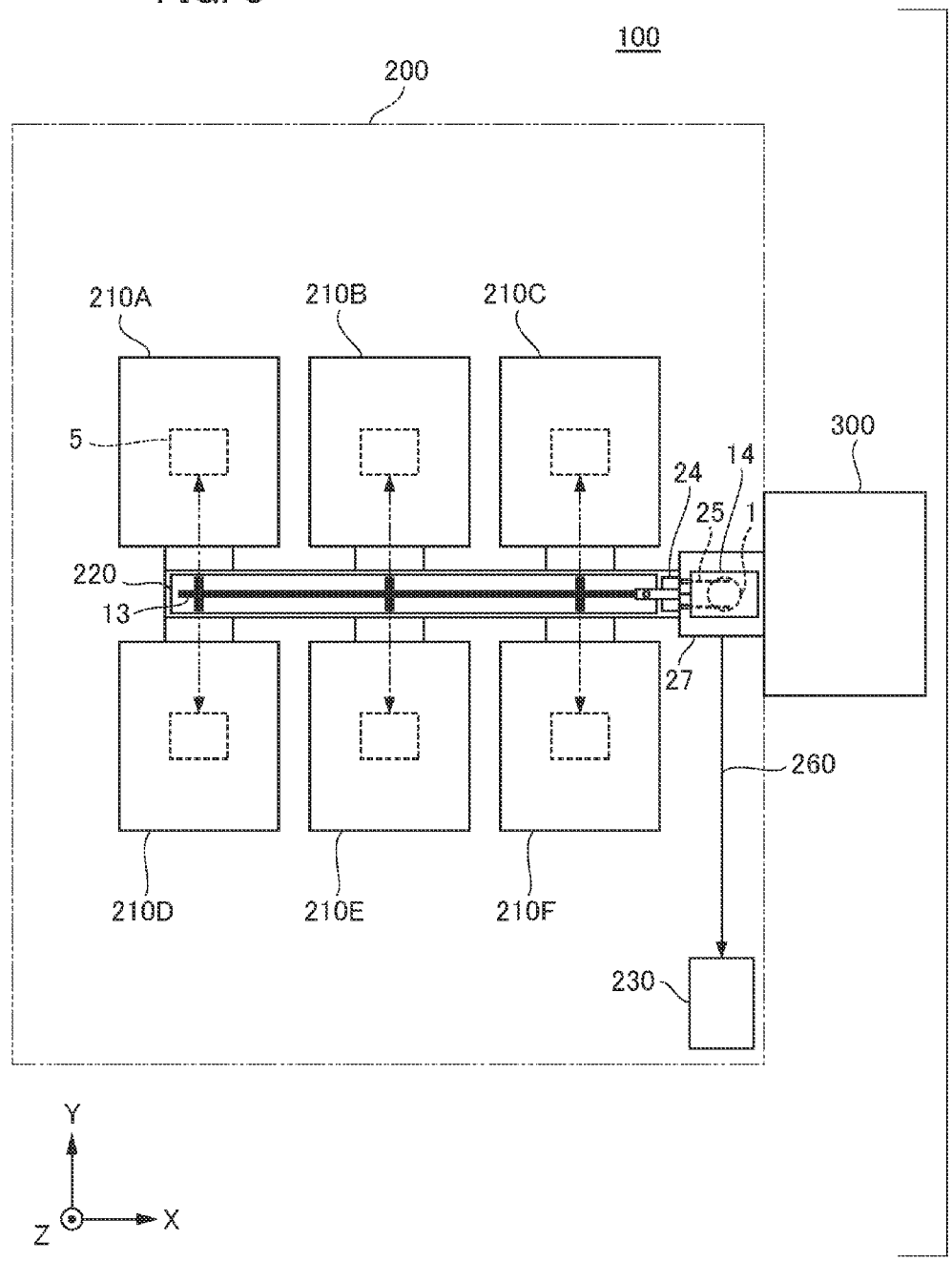
FIG. 8 is a plan view showing a configuration of a lithography apparatus according to a second embodiment of the present invention.

FIG. 8 is a schematic plan view showing a configuration of the cluster-type imprint apparatus according to the embodiment and the imprint system (the lithography system) including the cluster-type imprint apparatus. Further, components that are the same as those of the cluster-type imprint apparatus 200 and the imprint system 100 according to the first embodiment of FIG. 1 are designated by the same reference numerals. First, the substrate storing unit 14 applied to this embodiment has a detection unit 28 (see FIGS. 3(A) and 3(B)) configured to detect a position of each of the wafers 1 stored therein. For this, the cluster-type imprint apparatus 200 according to this embodiment has an acquisition apparatus (an acquisition unit) 27 configured to acquire position information detected by the detection unit 28 at a position at which the installation section 20 according to the first embodiment is present. Here, the acquired position information corresponds to the specific information corresponding to the wafer 1. Then, the cluster control unit (controller) 230 processes the wafers 1 at the processing units 210A to 210F corresponding thereto based on the specific information as in the first embodiment. The same effect as the first embodiment is exhibited in this embodiment. In addition, the cluster control unit (controller) 230 may acquire the specific information from the plurality of substrates that belong to the lot or the substrate storing unit 14 that receives the plurality of substrates via the detection unit 28. In this case, each substrate or (each receiving place of) the substrate storing unit 14 may include a device or a portion configured to store or record the specific information.

(Third Embodiment)

Next, in relation with the above-mentioned embodiments, a lithography apparatus according to a third embodiment of the present invention will be described. A characteristic of the lithography apparatus according to this embodiment is that the cluster control unit (controller) 230 can transmit the information related to the processing unit used for the patterning among the plurality of processing units 210A to 210F to the pre-processing device 300. Further, the pre-processing device 300 includes a control unit related to the pre-processing device. According to the above-mentioned configuration, the pre-processing device 300 can modify the timing or sequence of the processing of the wafers 1 according to the processing unit 210 that is in use. In the lithography apparatus, in all of the processing units 210, the case in which the pattern forming processing (patterning) cannot be started during a maintenance operation or the like, the case in which the pre-processed wafer 1 stays in the lithography apparatus for a long time according to a decrease in throughput, or the like, is also considered. In particular, the staying for a long time in the lithography apparatus is not preferable in view of contamination. Here, when such an event occurs, the cluster control unit (controller) 230 previously transmits the information to the pre-processing device 300, and modifies the timing or sequence of the processing of the wafers 1. Accordingly, in addition to the superposition precision, the lithography apparatus advantageous for productivity or a yield rate can be provided.

Further, in the above-mentioned embodiments, while a so-called in-line type configuration in which the pre-processing device 300 and the processing units 210A to 210F are connected has been provided, the present invention is not limited thereto. For example, the pre-processing device (the heat treatment apparatus or the like (not shown)) and the processing units are disposed apart from each other, and the device may also be applied to a type in which the wafer 1 is conveyed therebetween by the FOUP using overhead hoist transport (OHT). In this case, reference numeral 300 in FIG.

1 is an equipment front end module (EFEM). Then, though not shown, the plurality of FOUPs corresponding to the processing units 210A to 210F are installed (accommodated) at the front surface of the EFEM 300.

In addition, in the above-mentioned embodiments, while the imprint apparatus has been exemplified as the lithography apparatus, the present invention is not limited thereto. The apparatus may be an apparatus for performing the patterning on the substrate, and for example, may be implemented as an exposure apparatus, a painting apparatus, or the like. The exposure apparatus forms a (latent image) pattern on a substrate (an upper resist) using, for example, (extreme) ultraviolet light. In addition, the painting apparatus forms a (latent image) pattern on a substrate (an upper resist) using, for example, a charged particle beam (an electron beam or the like).

Figure 9:
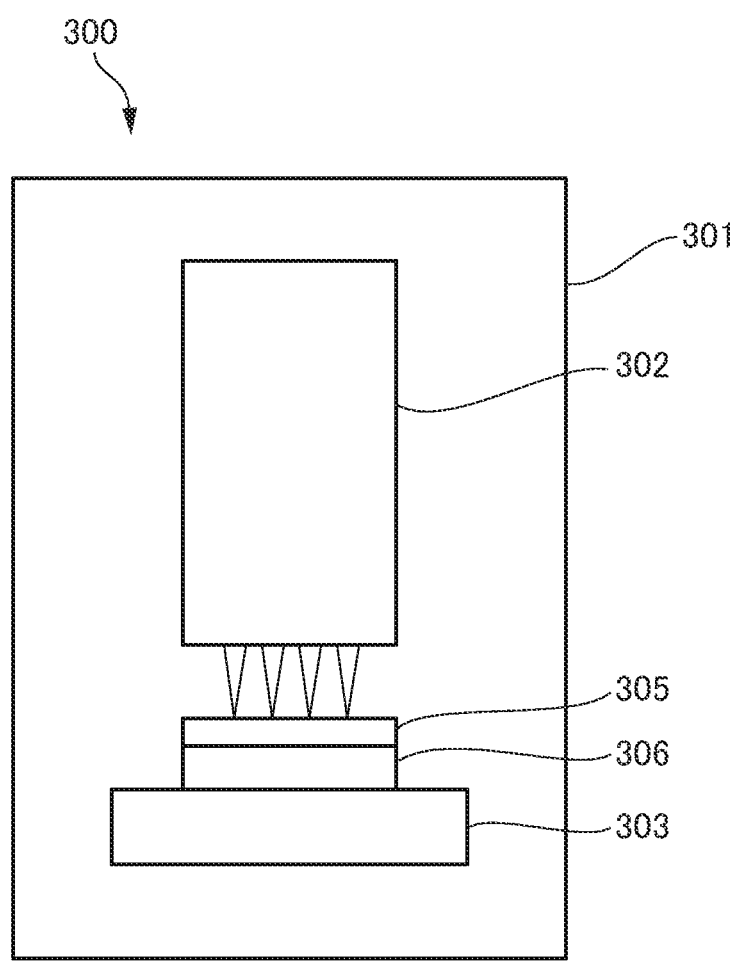
FIG. 9 is a view showing a configuration of another processing unit applied to the lithography apparatus.

FIG. 9 is a view showing another configuration example of one processing unit among the plurality of processing units in the lithography apparatus according to the embodiment. Here, a cluster-type painting apparatus including a plurality of processing units (painting processing units) 300 configured to perform painting using an electron beam is exemplified as the lithography apparatus. Further, the electron beam may be another charged particle beam such as an ion beam or the like. The processing unit 300 includes a vacuum chamber 301, an electronic optical system 302 and a driving apparatus 303 that are accommodated in the vacuum chamber 301, and a stage (a holder) 306 configured to hold a substrate 305, and performs painting on the substrate 305 using the electron beam in a vacuum. The driving apparatus 303 is configured to move the holder 306 to position the substrate 305 with respect to the electronic optical system 302.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

(Article Manufacturing Method)

A method of manufacturing an article according to an embodiment of the present invention is suitable for manufacturing an article such as a microdevice (for example, a semiconductor device) or an element having a microstructure. This manufacturing method can include a step of forming a pattern (for example, a latent image pattern) on an object (for example, a substrate on which surface having a photosensitive material) by using the above-described lithography apparatus, and a step of processing the object on which the pattern is formed (for example, a step of developing). Further, this manufacturing method includes other well-known steps (for example, oxidization, deposition, vapor deposition, doping, planarization, etching, resist removal, dicing, bonding, packaging and the like). The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-027968 filed Feb. 16, 2015, and Japanese Patent Application No. 2015-239907 filed Dec. 9, 2015, which are hereby incorporated by reference herein in its entirety.

What is claimed is:

1. A lithography apparatus for performing patternings on a resin applied onto a plurality of substrates that belong to a lot, the apparatus comprising:
   a first processing unit configured to perform the patternings;
   a second processing unit, which is different from the first processing unit, configured to perform the patternings;
   a conveyance unit configured to convey a first substrate, among the plurality of substrates, to the first processing unit and convey a second substrate, among the plurality of substrates, to the second processing unit based on specific information that specifies each of the plurality of substrates, the second substrate being different from the first substrate; and
   a controller configured to control the first processing unit, the second processing unit, and the conveyance unit to process the first substrate and the second substrate, respectively in parallel.

2. The apparatus according to claim 1, wherein the controller has information of a plurality of groups into which the first and second processing units are classified, and is configured to control the first and second processing units and the conveyance unit to process the first and second substrates respectively in parallel further based on previously set correspondence relation between one of the plurality of groups and the specific information.

3. The apparatus according to claim 1, wherein the controller is configured to obtain the specific information based on an order of one of the plurality of substrates conveyed from a preprocessing apparatus that has performed preprocessing on the plurality of substrates by the conveyance unit.

4. The apparatus according to claim 1, wherein the controller is configured to obtain the specific information based on a position of one of the plurality of substrates in a pod for the plurality of substrates.

5. The apparatus according to claim 1, further comprising a device configured to obtain the specific information from each of the plurality of substrates or a pod for the plurality of substrates.

6. The apparatus according to claim 1, wherein the controller is configured to control the first and second processing units and the conveyance unit to process the first and second substrates respectively in parallel further based on recipe information corresponding to the lot.

7. The apparatus according to claim 1, further comprising:
a receiving device configured to receive information relating to determination of one of the first and second processing units that processes one of the plurality of substrates, and
wherein the controller is configured to control the first and second processing units and the conveyance unit to process the first and second substrates respectively in parallel further based on the received information.

8. The apparatus according to claim 1, wherein the controller is configured to transmit information relating to the first and second processing units to a preprocessing apparatus that performs preprocessing on the plurality of substrates or a control apparatus that controls the preprocessing apparatus, and control the first and second processing units and the conveyance unit to process the first and second substrates respectively in parallel based on the specific information and the transmitted information.

9. The lithography apparatus according to claim 8, wherein the controller is configured to transmit the relating information based on a state of each of the first and second processing units.

10. The lithography apparatus according to claim 1, wherein the controller is configured to determine a processing condition for the patterning with respect to each of the first and second processing units based on the specific information and recipe information corresponding to the lot.

11. The lithography apparatus according to claim 1, wherein each of the first and second processing units is configured to perform the patterning by imprint.

12. The lithography apparatus according to claim 1, wherein each of the first and second processing units is configured to perform the patterning with a charged particle beam.

13. A lithography method of performing patternings on a resin applied onto a plurality of substrates that belong to a lot using a first processing unit, a second processing unit, which is different from the first processing unit, and a conveyance unit, the method comprising steps of:
controlling the conveyance unit to convey a first substrate, among the plurality of substrates, to the first processing unit and convey a second substrate, among the plurality of substrates, to the second processing unit based on specific information that specifies each of the plurality of substrates, the second substrate being different from the first substrate; and
controlling the first processing unit, the second processing unit, and the conveyance unit to process the first substrate and the second substrate, respectively in parallel.

14. A non-transitory computer-readable storage medium which stores a program for causing a computer to execute a method of performing patternings on a resin applied onto a plurality of substrates that belong to a lot using a first processing unit, a second processing unit, which is different from the first processing unit, and a conveyance unit, the method including the steps of:
controlling the conveyance unit to convey a first substrate, among the plurality of substrates, to the first processing unit and convey a second substrate, among the plurality of substrates, to the second processing unit based on specific information that specifies each of the plurality of substrates, the second substrate being different from the first substrate; and
controlling the first processing unit, the second processing unit, and the conveyance unit to process the first substrate and the second substrate, respectively in parallel.

15. A lithography system comprising:
a lithography apparatus for performing patternings on a resin applied onto a plurality of substrates that belong to a lot; and
a preprocessing apparatus configured to supply the substrate to the lithography apparatus,
wherein the lithography apparatus comprises:
a first processing unit configured to perform the patternings;
a second processing unit, which is different from the first processing unit, configured to perform the patternings;
a conveyance unit configured to convey a first substrate, among the plurality of substrates, to the first processing unit and convey a second substrate, among the plurality of substrates, to the second processing unit based on specific information that specifies each of the plurality of substrates, the second substrate being different from the first substrate; and
a controller configured to control the first processing unit, the second processing unit, and the conveyance unit to process the first substrate and the second substrate, respectively in parallel.

16. A method of manufacturing an article, the method comprising steps of:
performing patterning on a substrate using a lithography apparatus for performing patternings on a resin applied onto a plurality of substrates that belong to a lot;
processing the substrate, on which the patterning has been performed, to manufacture the article,
wherein the lithography apparatus includes:
a first processing unit configured to perform the patternings;
a second processing unit, which is different from the first processing unit, configured to perform the patternings;
a conveyance unit configured to convey a first substrate, among the plurality of substrates, to the first processing unit and convey a second substrate, among the plurality of substrates, to the second processing unit based on specific information that specifies each of the plurality of substrates, the second substrate being different from the first substrate; and
a controller configured to control the first processing unit, the second processing unit, and the conveyance unit to process the first substrate and the second substrate, respectively in parallel.

17. A method of manufacturing an article, the method comprising steps of:
performing patterning on a substrate using a lithography method; and
processing the substrate, on which the patterning has been performed, to manufacture the article,
wherein the lithography method performs patternings on a resin applied onto a plurality of substrates that belong to a lot using a first processing unit, a second processing unit, which is different from the first processing unit, and a conveyance unit, the lithography method including the steps of:

controlling the conveyance unit to convey a first substrate, among the plurality of substrates, to the first processing unit and convey a second substrate, among the plurality of substrates, to the second processing unit based on specific information that specifies each of the plurality of substrates, the second substrate being different from the first substrate; and controlling the first processing unit, the second processing unit, and the conveyance unit to process the first substrate and the second substrate, respectively in parallel.

18. A method of manufacturing an article, the method comprising steps of:

performing patterning on a substrate using a lithography system; and processing the substrate, on which the patterning has been performed, to manufacture the article, wherein the lithography system includes:
a lithography apparatus for performing patternings on a resin applied onto a plurality of substrates that belong to a lot; and
a preprocessing apparatus configured to supply a substrate to the lithography apparatus,
wherein the lithography apparatus includes:

a first processing unit configured to perform the patternings;

a second processing unit, which is different from the first processing unit, configured to perform the patternings;

a conveyance unit configured to convey a first substrate, among the plurality of substrates, to the first processing unit and convey a second substrate, among the plurality of substrates, to the second processing unit based on specific information that specifies each of the plurality of substrates, the second substrate being different from the first substrate; and a controller configured to control the first processing unit, the second processing unit, and the conveyance unit to process the first substrate and the second substrate, respectively in parallel.

19. The apparatus according to claim 1, wherein the controller is configured to transmit information relating to the first and second processing units to a preprocessing apparatus that performs preprocessing on the plurality of substrates before the patternings onto the plurality of substrates, to change a timing or an order when the preprocessing is performed on the plurality of substrates and perform the patternings onto the plurality of substrates using the first and second processing units in parallel.

* * * * *